United States Patent
Xu et al.

(10) Patent No.: US 10,921,668 B1
(45) Date of Patent: Feb. 16, 2021

(54) PIXEL UNIT, PIXEL ARRAY, AND DISPLAY PANEL

(71) Applicant: TCL China Star Optoelectronics Technology Co., Ltd., Guangdong (CN)

(72) Inventors: Shifeng Xu, Guangdong (CN); Tienchun Huang, Guangdong (CN); Peng Du, Guangdong (CN); Meng Li, Guangdong (CN); Jianhong Chen, Guangdong (CN); Jianjian Ying, Guangdong (CN); Wen Dai, Guangdong (CN); Chengyu Yang, Guangdong (CN); Yi Wu, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/620,818

(22) PCT Filed: Oct. 29, 2019

(86) PCT No.: PCT/CN2019/113942
§ 371 (c)(1),
(2) Date: Dec. 9, 2019

(30) Foreign Application Priority Data

Sep. 10, 2019 (CN) .......................... 2019 1 0854549

(51) Int. Cl.
*G02F 1/1362* (2006.01)
*G02F 1/1368* (2006.01)

(52) U.S. Cl.
CPC ...... *G02F 1/136286* (2013.01); *G02F 1/1368* (2013.01)

(58) Field of Classification Search
CPC .................................................. G02F 1/136286
See application file for complete search history.

(56) References Cited

U.S. PATENT DOCUMENTS

2020/0212125 A1* 7/2020 Liu ..................... H01L 27/3218

FOREIGN PATENT DOCUMENTS

| CN | 101364020 B | | 9/2010 | |
| CN | 101364020 A | * | 2/2019 | ........... G02F 1/1362 |
| CN | 109887958 | * | 6/2019 | ............. H01L 27/32 |
| CN | 109887958 A | * | 6/2019 | ............. H01L 27/32 |
| CN | 109887958 A | | 6/2019 | |

* cited by examiner

*Primary Examiner* — Sang V Nguyen

(57) ABSTRACT

The invention provides a pixel unit, a pixel array, and a display panel. The pixel unit includes a first sub-pixel unit, a second sub-pixel unit, and a third sub-pixel unit, and the sub-pixel units share one data line. In the pixel unit of the present invention, which utilizes a plurality of sub-pixel units in the pixel unit sharing the same data line and simultaneously gate lines of a plurality of sub-pixel units arranging in parallel in the pixel unit, therefore, to save a wiring area, and an aperture ratio of the pixel unit is increased. Thereby increasing the light transmittance of the display panel and improving the display effect of the product.

14 Claims, 2 Drawing Sheets

PIXEL UNIT, PIXEL ARRAY, AND DISPLAY PANEL

FIELD OF INVENTION

The present invention relates to the field of display technologies, and in particular, to a pixel unit, a pixel array, and a display panel.

BACKGROUND OF INVENTION

Display panels, such as organic light-emitting diode (OLED) panels, have received great attention from academia and industry because of their great potential in solid-state lighting and flat panel display.

The conventional liquid crystal display units adopt a rectangular design scheme, and each pixel includes three sub-pixel units of red, green, and blue, and each row of sub-pixel units has a gate line. There is a data line between each row of sub-pixel units, and in order to reduce the influence of signal lines on pixel electrodes, a certain space is usually set between the signal lines and the pixel electrodes, the wiring area of the signal lines and the reserved spaces will reduce an effective aperture ratio of the pixel units. Thereby reducing the light transmittance of liquid crystal displays, increasing power consumption of liquid crystal displays, and reducing the service life of liquid crystal displays.

SUMMARY OF INVENTION

The present invention is directed to a display panel of the conventional art, which has a low effective aperture ratio of pixel units and a low light transmittance of the display panel, and proposes a pixel unit, a pixel array, and a display panel.

In a first aspect, the present application provides a pixel unit, the pixel unit including a first sub-pixel unit, a second sub-pixel unit, and a third sub-pixel unit; wherein at least two of the first sub-pixel unit, the second sub-pixel unit, and the third sub-pixel unit share a data line.

Furthermore, the first sub-pixel unit includes a first thin film transistor and a first gate line, the second sub-pixel unit includes a second thin film transistor and a second gate line, and the third sub-pixel unit includes a third thin film transistor and a third gate line, wherein the first gate line, the second gate line, and the third gate line are parallel disposed in the pixel unit.

Furthermore, all the first sub-pixel unit, the second sub-pixel unit, and the third sub-pixel unit are rhombus structures, the first sub-pixel unit, the second sub-pixel unit, and the third sub-pixel unit are connected to each other, and the pixel unit is a hexagonal structure.

Furthermore, all the first sub-pixel unit, the second sub-pixel unit, and the third sub-pixel unit are rhombus structures with equal lengths, and two apex angles of the rhombus structures are 60° and 120° respectively.

Furthermore, the pixel unit is a regular hexagonal structure.

Furthermore, the first thin film transistor, the second thin film transistor, and the third thin film transistor are disposed at a center of a regular hexagonal structure of the pixel unit.

In a second aspect, the present application provides a pixel array, the pixel array including a plurality of pixel units connected to each other to form the pixel array in a honeycomb shape, wherein each of the pixel units includes a first sub-pixel unit, a second sub-pixel unit, and a third sub-pixel unit, and at least two of the first sub-pixel unit, the second sub-pixel unit, and the third sub-pixel unit share a data line.

Furthermore, the first sub-pixel unit includes a first thin film transistor and a first gate line, the second sub-pixel unit includes a second thin film transistor and a second gate line, and the third sub-pixel unit includes a third thin film transistor and a third gate line, wherein the first gate line, the second gate line, and the third gate line are parallel disposed in the pixel unit.

Furthermore, all the first sub-pixel unit, the second sub-pixel unit, and the third sub-pixel unit are rhombus structures, the first sub-pixel unit, the second sub-pixel unit, and the third sub-pixel unit are connected to each other, and the pixel unit is a hexagonal structure.

Furthermore, all the first sub-pixel unit, the second sub-pixel unit, and the third sub-pixel unit are rhombus structures with equal lengths, and two apex angles of the rhombus structures are 60° and 120° respectively.

Furthermore, the pixel unit is a regular hexagonal structure.

Furthermore, the first thin film transistor, the second thin film transistor, and the third thin film transistor are disposed at a center of a regular hexagonal structure of the pixel unit.

Furthermore, structures of the plurality of pixel units are the same.

Furthermore, in the plurality of pixel units, pixel colors of the sub-pixel units in contact with each other of two pixel units that are in contact with each other are different.

In a third aspect, the present application further provides a display panel, where the display panel includes a pixel array including a plurality of pixel units connected to each other to form the pixel array in a honeycomb shape, wherein each of the pixel units includes a first sub-pixel unit, a second sub-pixel unit, and a third sub-pixel unit, and at least two of the first sub-pixel unit, the second sub-pixel unit, and the third sub-pixel unit share a data line.

Furthermore, the first sub-pixel unit includes a first thin film transistor and a first gate line, the second sub-pixel unit includes a second thin film transistor and a second gate line, and the third sub-pixel unit includes a third thin film transistor and a third gate line, wherein the first gate line, the second gate line, and the third gate line are parallel disposed in the pixel unit.

Furthermore, all the first pixel sub-pixel unit, the second pixel sub-pixel unit, and the third pixel sub-pixel unit are rhombus structures, the first pixel sub-pixel unit, the second sub-pixel unit, and the third sub-pixel unit are connected to each other, and the pixel unit is a hexagonal structure.

Furthermore, all the first sub-pixel unit, the second sub-pixel unit, and the third sub-pixel unit are rhombus structures with equal lengths, and two apex angles of the rhombus structures are 60° and 120° respectively.

Furthermore, the pixel unit is a regular hexagonal structure.

Furthermore, the first thin film transistor, the second thin film transistor, and the third thin film transistor are disposed at a center of a regular hexagonal structure of the pixel unit.

The beneficial effects of the present invention are as follows. The pixel unit provided by the present invention, by sharing a plurality of sub-pixel units in a pixel unit with the same data line, simultaneously arranging the gate lines of the plurality of sub-pixel units in parallel in the pixel unit internally, the wiring area is saved, and the aperture ratio of the pixel unit is increased. Thereby increasing the light transmittance of display panels and improving the display effect of products.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF EMBODIMENTS

Figure 1:
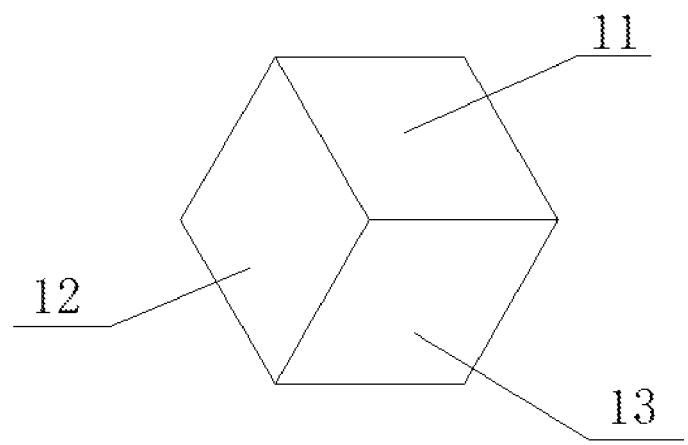
FIG. 1 is a schematic diagram of a pixel unit according to an embodiment of the present invention.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

In addition, the size and thickness of each component shown in the drawings are arbitrarily shown for the sake of understanding and convenience of description, but the invention is not limited thereto.

In the drawings, the thickness of layers, films, panels, regions, etc. are exaggerated for clarity. In the drawings, the thickness of layers and regions are exaggerated for ease of understanding and ease of description. It is to be noted that when a component such as a layer, a film, a region or a substrate is referred to as "on" another component, the component may be directly on the other component or may be an intermediate component.

In addition, in the specification, the term "including" is to be understood to include the component, but does not exclude any other component. Furthermore, in the specification, "on" means position above or below a target component, and does not mean that it must be on the top based on the direction of gravity.

In order to further explain the technical means and functions of the present invention for achieving the predetermined purpose, the specific embodiments, structures, features, and efficacy of the purposed pixel unit, pixel array, and display panel are described in detail below following with reference to the accompanying drawings and preferred embodiments.

A pixel unit in the conventional art includes three sub-pixel units of red R, green G, and blue B. Due to a gate line is set between each sub-pixel unit, and a data line is set between each row and column of each sub-pixel unit, moreover, a certain space is set between signal lines and electrodes. Therefore, a wiring area of the signal lines and the preset spaces reduce an effective aperture ratio of the pixel unit, thereby reducing the light transmittance of the display panel.

In view of the above problems, the present invention provides a pixel unit including a first sub-pixel unit, a second sub-pixel unit, and a third sub-pixel unit, and the first sub-pixel unit, the second sub-pixel unit, and the third pixel, and at least two of the first sub-pixel unit, the second sub-pixel unit, and the third sub-pixel unit share a data line.

The pixel unit provided by the present invention utilizes a plurality of sub-pixel units in the pixel unit sharing the same data line and simultaneously gate lines of a plurality of sub-pixel units arranging in parallel in the pixel unit, therefore, to save a wiring area, and an aperture ratio of the pixel unit is increased. Thereby increasing the light transmittance of the display panel and improving the display effect of the product.

Specifically, in the embodiments of the present invention, at least two sub-pixel units share one data line, which can be any two sub-pixel units of the first sub-pixel unit, the second sub-pixel unit, and the third sub-pixel unit share the same data line. In other embodiments of the present invention, the same data line can be shared by the first sub-pixel unit, the second sub-pixel unit, and the third sub-pixel unit.

As shown in FIG. 1, a schematic diagram of an embodiment of the pixel unit provided by the present invention, wherein the pixel unit 10 includes the first sub-pixel unit 11, the second sub-pixel unit 12, and the third sub-pixel unit 13, and the first sub-pixel unit 11, the second sub-pixel unit 12, and the third sub-pixel unit 13 are connected to each other.

In an embodiment of the present invention, the first sub-pixel unit 11, the second sub-pixel unit 12, and the third sub-pixel unit 13 can all be parallelogram structures. Moreover, the first sub-pixel unit 11, the second sub-pixel unit 12, and the third sub-pixel unit 13 are connected to each other to form the pixel unit 10, and the pixel unit 10 is a hexagonal structure.

Specifically, all the first sub-pixel unit 11, the second sub-pixel unit 12, and the third sub-pixel unit 13 are rhombus structures.

Furthermore, all the first sub-pixel unit 11, the second sub-pixel unit 12, and the third sub-pixel unit 13 can be rhombus structures with equal lengths, and two apex angles of the rhombus structures are 60° and 120° respectively. At this time, the pixel unit 10 consisted of the first sub-pixel unit 11, the second sub-pixel unit 12, and the third sub-pixel unit 13 is a regular hexagonal structure.

Figure 2:
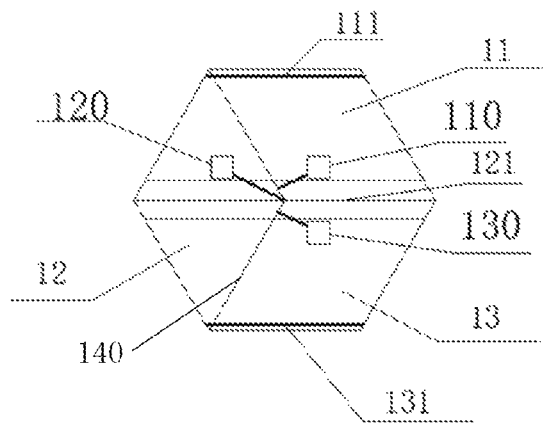
FIG. 2 is a partially enlarged view of the pixel unit according to an embodiment of the present invention.

FIG. 2 is a partially enlarged view of the pixel unit according to an embodiment of the present invention. In the pixel unit 10, there is a data line 140, and the data line 140 simultaneously controls three sub-pixel units. Specifically, the data line 140 has three branch lines in the pixel unit internally, and each of the branch lines is respectively connected to a thin film transistor in each of the sub-pixel units for controlling the sub-pixel unit. Since one data line is used to control three sub-pixel units, the number of lines in the pixel unit is reduced, wiring area is saved, thereby increasing the aperture ratio of the pixel unit and increasing the light transmittance of the display panel.

Specifically, the first sub-pixel unit 11 includes a first thin film transistor 110 and a first gate line 111, and the second sub-pixel unit 12 includes a second thin film transistor 120 and a second gate line 121, and a third sub-pixel unit includes a third thin film transistor 130 and the third gate line 131. Meanwhile, the first gate line 111, the second gate line 121, and the third gate line 131 are disposed in parallel inside the pixel unit 10.

The first thin film transistor 110, the second thin film transistor 120, and the third thin film transistor 130 are all positioned near center of the regular hexagonal structure of the pixel unit 10 by 120°, and the first thin film transistor 110, the second thin film transistor 120, and the third thin film transistor 130 are respectively connected to the data line 140 in the pixel unit 10 at the center of the structure of the pixel unit 10, and the three sub-pixel units share same data line 140. The respective gate lines of the first sub-pixel unit 11, the second sub-pixel unit 12, and the third sub-pixel unit 13 are disposed in parallel inside the pixel unit to save wiring area.

In the above embodiment, the first sub-pixel unit 11, the second sub-pixel unit 12, and the third sub-pixel unit 13 share one data line 140, that is, the data line 140 controls three pixels in the pixel unit 10. The number of data lines in the pixel unit is reduced, the wiring area is saved, thereby increasing the aperture ratio of the pixel unit and increasing the light transmittance of the display panel.

Figure 3:
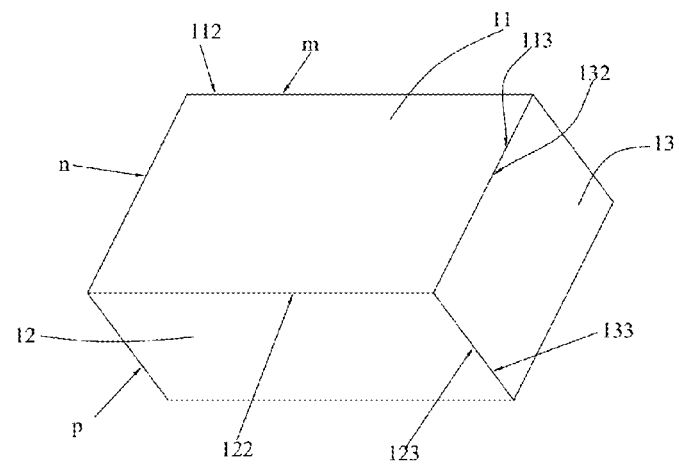
FIG. 3 is a schematic diagram of the pixel unit according to another embodiment of the present invention.

FIG. 3 is a schematic diagram of another embodiment of the pixel unit provided by the present invention. The pixel unit 20 includes a first sub-pixel unit 11, a second sub-pixel unit 12, and a third sub-pixel unit 13, and the first sub-pixel unit 11 is a parallelogram structure having unequal lengths.

Specifically, the first sub-pixel unit 11 is a parallelogram structure with lengths m and n, and a first side 122 of the second sub-pixel unit 12 connected to the first sub-pixel unit 11 has a length equal to a length of a first side 112 of the first sub-pixel unit 11. In this embodiment, if the length of the first side 112 of the first sub-pixel unit 11 is m, the length of the first side 122 of the second sub-pixel unit 12 is also m.

A second side 113 of the first sub-pixel unit 11 is connected to a first side 132 of the third sub-pixel unit 13, and a second side 123 of the second sub-pixel unit 12 is connected to a second side 133 of the third sub-pixel unit 13. At this time, the length of the first side 132 of the third sub-pixel unit 13 is equal to the length of the second side 113 of the first sub-pixel unit 11, that is, the length of the first side of the third sub-pixel unit is n. At this time, if the length of the second side 123 of the second sub-pixel unit 12 is p, the length of the second side 133 of the third sub-pixel unit 13 is equal to the length of the second side 123 of the second sub-pixel unit 12, that is, p.

At this time, the first sub-pixel unit 11 is a parallelogram structure having side lengths of m and n respectively, the second sub-pixel unit 12 is a parallelogram structure having side lengths of m and p respectively, and the third sub-pixel unit 13 is a parallelogram structure having side lengths of n and p respectively. Moreover, the first sub-pixel unit 11, the second sub-pixel unit 12, and the third sub-pixel unit 13 are connected to form the pixel unit 20. The pixel unit 20 is a hexagonal structure. And m, n, and p are not equal.

It should be noted that, in the embodiments of the foregoing pixel unit, a color of the sub-pixel unit can be selected from one of three colors of red R, green G, or blue B, but in one pixel unit, the colors of the three sub-pixel units are different.

The present invention further provides a pixel array including a plurality of pixel units, that is, the plurality of pixel units are connected to each other to form the pixel array.

The pixel array provided by the present invention includes the plurality of pixel units, which utilizes a plurality of sub-pixel units in the pixel unit sharing the same data line and simultaneously gate lines of a plurality of sub-pixel units arranging in parallel in the pixel unit, therefore, to save a wiring area, and an aperture ratio of the pixel unit is increased. Thereby increasing the light transmittance of the display panel and improving the display effect of the product.

In an embodiment of the invention, the plurality of pixel units can be connected to each other in a honeycomb shape to form the pixel array. That is, the plurality of pixel units are sequentially arranged in a honeycomb connection and toward outside until the pixel array is formed to cover the entire display panel.

It should be noted that, in the above embodiments, the structures of the plurality of pixel units can be same or different. The pixel array in an embodiment provided by the present invention, a structure of at least one of the plurality of pixel units is same as the structure of the pixel unit in the foregoing embodiments, that is, among the plurality of pixel units of the pixel array, in at least one pixel unit, at least two of the first sub-pixel unit, the second sub-pixel unit, and the third sub-pixel unit share one data line.

Specifically, among the plurality of pixel units forming the pixel array, the plurality of pixel units can all are regular hexagonal structures, and at this time, the three sub-pixel units constituting the pixel unit are all rhombic structures having same structure and with equal lengths.

It should be noted that, in the above embodiment, the plurality of pixel units are connected to each other, and each pixel unit further includes three sub-pixel units, and colors of the sub-pixel units in contact with each other of two adjacent pixel units are different.

Figure 4:
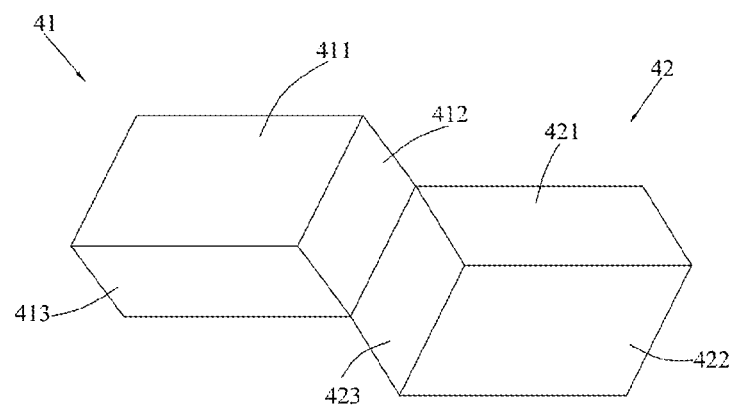
FIG. 4 is a partially enlarged view of a pixel array according to an embodiment of the present invention.

As shown in FIG. 4, a partially enlarged view of the pixel array provided by an embodiment of the present invention, the pixel array includes a third pixel unit 41 and a fourth pixel unit 42, wherein the pixel unit 41 includes a fourth sub-pixel unit 411 and a fifth sub-pixel unit 412, and a sixth sub-pixel unit 413. The fourth pixel unit 42 includes a seventh sub-pixel unit 421, an eighth sub-pixel unit 422, and a ninth sub-pixel unit 423.

In this embodiment, the fourth sub-pixel unit 411, the fifth sub-pixel unit 412, and the sixth sub-pixel unit 413 are respectively one of three colors of red R, green G, and blue B. Specifically, the fourth sub-pixel unit 411 can be R, that is, red; the fifth sub-pixel unit 412 can be G, that is, green; and the sixth sub-pixel unit 413 can be B, that is, blue.

At this time, since the ninth sub-pixel unit 423 of the fourth pixel unit 42 and the fifth sub-pixel unit 412 of the third pixel unit 41 are connected to each other, and the fourth sub-pixel unit 412 is red, the ninth sub-pixel unit 423 can be blue or green, and in this embodiment, the ninth sub-pixel unit 423 is blue.

The present invention further provides a display panel including a pixel array according to aforementioned pixel array. The display panel provided by the present invention, which utilizes a plurality of sub-pixel units in the pixel unit sharing the same data line and simultaneously gate lines of a plurality of sub-pixel units arranging in parallel in the pixel unit, therefore, to save a wiring area, and an aperture ratio of the pixel unit is increased. Thereby increasing the light transmittance of the display panel and improving the display effect of the product.

According to the above object of the present invention, a pixel array including the above-described pixel unit is proposed. The working principle of the pixel array provided in this embodiment is consistent with the working principle of the pixel unit of the foregoing embodiments. For the specific structural relationship and working principle, refer to the pixel unit in the foregoing embodiments, and details are not described herein again.

According to the above object of the present invention, a display panel including the above-described pixel array is proposed. The working principle of the display panel provided in this embodiment is consistent with the working principle of the pixel array of the foregoing embodiments. For the specific structural relationship and working principle, refer to the pixel array in the foregoing embodiments, and details are not described herein again.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A pixel unit, comprising:
    a first sub-pixel unit, a second sub-pixel unit, and a third sub-pixel unit;
    wherein at least two of the first sub-pixel unit, the second sub-pixel unit, and the third sub-pixel unit share a data line;
    wherein the first sub-pixel unit comprises a first thin film transistor and a first gate line, the second sub-pixel unit comprises a second thin film transistor and a second gate line, and the third sub-pixel unit comprises a third thin film transistor and a third gate line, wherein the first gate line, the second gate line, and the third gate line are parallelly disposed in the pixel unit;
    wherein the first thin film transistor, the second thin film transistor, and the third thin film transistor are disposed at a center of a regular hexagonal structure of the pixel unit.

2. The pixel unit according to claim 1, wherein all the first sub-pixel unit, the second sub-pixel unit, and the third sub-pixel unit are rhombus structures, the first sub-pixel unit, the second sub-pixel unit, and the third sub-pixel unit are connected to each other, and the pixel unit is a hexagonal structure.

3. The pixel unit according to claim 2, wherein all the first sub-pixel unit, the second sub-pixel unit, and the third sub-pixel unit are rhombus structures with equal lengths, and two apex angles of the rhombus structures are 60° and 120° respectively.

4. The pixel unit according to claim 3, wherein the pixel unit is a regular hexagonal structure.

5. A pixel array, comprising:
    a plurality of pixel units connected to each other to form the pixel array in a honeycomb shape;
    wherein each of the pixel units comprises a first sub-pixel unit, a second sub-pixel unit, and a third sub-pixel unit, and at least two of the first sub-pixel unit, the second sub-pixel unit, and the third sub-pixel unit share a data line;
    wherein the first sub-pixel unit comprises a first thin film transistor and a first gate line, the second sub-pixel unit comprises a second thin film transistor and a second gate line, and the third sub-pixel unit comprises a third thin film transistor and a third gate line, wherein the first gate line, the second gate line, and the third gate line are parallelly disposed in the pixel unit;
    wherein the first thin film transistor, the second thin film transistor, and the third thin film transistor are disposed at a center of a regular hexagonal structure of the pixel unit.

6. The pixel array according to claim 5, wherein all the first sub-pixel unit, the second sub-pixel unit, and the third sub-pixel unit are rhombus structures, the first sub-pixel unit, the second sub-pixel unit, and the third sub-pixel unit are connected to each other, and the pixel unit is a hexagonal structure.

7. The pixel array according to claim 6, wherein all the first sub-pixel unit, the second sub-pixel unit, and the third sub-pixel unit are rhombus structures with equal lengths, and two apex angles of the rhombus structures are 60° and 120° respectively.

8. The pixel array according to claim 7, wherein the pixel unit is a regular hexagonal structure.

9. The pixel array according to claim 5, wherein structures of the plurality of pixel units are the same.

10. The pixel array according to claim 5, wherein in the plurality of pixel units, pixel colors of the sub-pixel units in contact with each other of two pixel units that are in contact with each other are different.

11. A display panel, comprising:
    a pixel array comprising a plurality of pixel units connected to each other to form the pixel array in a honeycomb shape;
    wherein each of the pixel units comprises a first sub-pixel unit, a second sub-pixel unit, and a third sub-pixel unit, and at least two of the first sub-pixel unit, the second sub-pixel unit, and the third sub-pixel unit share a data line;
    wherein the first sub-pixel unit comprises a first thin film transistor and a first gate line, the second sub-pixel unit comprises a second thin film transistor and a second gate line, and the third sub-pixel unit comprises a third thin film transistor and a third gate line, wherein the first gate line, the second gate line, and the third gate line are parallelly disposed in the pixel unit;
    wherein the first thin film transistor, the second thin film transistor, and the third thin film transistor are disposed at a center of a regular hexagonal structure of the pixel unit.

12. The display panel according to claim 11, wherein all the first pixel sub-pixel unit, the second pixel sub-pixel unit, and the third pixel sub-pixel unit are rhombus structures, the first pixel sub-pixel unit, the second sub-pixel unit, and the third sub-pixel unit are connected to each other, and the pixel unit is a hexagonal structure.

13. The display panel according to claim 12, wherein all the first sub-pixel unit, the second sub-pixel unit, and the third sub-pixel unit are rhombus structures with equal lengths, and two apex angles of the rhombus structures are 60° and 120° respectively.

14. The display panel according to claim 13, wherein the pixel unit is a regular hexagonal structure.

* * * * *